(12) United States Patent
Goldberg (10) Patent No.: US 6,963,395 B2
(45) Date of Patent: Nov. 8, 2005

(54) METHOD AND APPARATUS FOR INSPECTING AN EUV MASK BLANK

(75) Inventor: Kenneth A. Goldberg, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 202 days.

(21) Appl. No.: 09/902,502

(22) Filed: Jul. 9, 2001

(65) Prior Publication Data

US 2003/0043370 A1 Mar. 6, 2003

(51) Int. Cl.⁷ .............................................. G01N 21/00
(52) U.S. Cl. ................................................. 356/237.5
(58) Field of Search ......................... 356/237.5, 237.4, 356/234.3, 239.8, 124, 354, 400, 337.5; 250/492.1–492.2, 491, 492; 359/731, 859, 726; 430/325, 326

(56) References Cited

U.S. PATENT DOCUMENTS

| | | | | |
|---|---|---|---|---|
| 5,541,416 A | * | 7/1996 | Washizuka | 250/458.1 |
| 5,911,858 A | * | 6/1999 | Ruffner | 204/192.27 |
| 5,940,173 A | * | 8/1999 | Tomii et al. | 356/445 |
| 6,007,963 A | * | 12/1999 | Felter et al. | 430/271.1 |
| 6,023,328 A | * | 2/2000 | Pierrat | 356/237.4 |
| 6,042,995 A | * | 3/2000 | White | 356/124 |
| 6,057,553 A | * | 5/2000 | Khursheed et al. | 250/442.11 |
| 6,133,576 A | * | 10/2000 | Shafer et al. | 250/461.1 |
| 6,142,641 A | * | 11/2000 | Cohen et al. | 359/731 |
| 6,178,221 B1 | * | 1/2001 | Levinson et al. | 378/34 |
| 6,285,497 B1 | * | 9/2001 | Sweatt et al. | 359/351 |
| 6,424,404 B1 | * | 7/2002 | Johnson | 355/44 |
| 6,555,828 B1 | * | 4/2003 | Bokor et al. | 250/492.2 |
| 6,556,286 B1 | * | 4/2003 | La Fontaine et al. | 356/124 |
| 6,577,389 B2 | * | 6/2003 | Biellak et al. | 356/237.4 |
| 6,603,543 B1 | * | 8/2003 | La Fontaine | 356/237.5 |
| 6,608,321 B1 | * | 8/2003 | La Fontaine et al. | 250/559.44 |
| 6,650,399 B2 | * | 11/2003 | Baselmans et al. | 355/55 |
| 6,738,135 B1 | * | 5/2004 | Underwood et al. | 356/237.5 |
| 2002/0175690 A1 | * | 11/2002 | Lebert et al. | 324/644 |

* cited by examiner

Primary Examiner—Thien M. Le
Assistant Examiner—Edwyn Labaze
(74) Attorney, Agent, or Firm—John P. O'Banion (57) ABSTRACT

An apparatus and method for at-wavelength EUV mask-blank characterization for inspection of moderate and low spatial frequency coating uniformity using a synchrotron or other source of EUV light. The apparatus provides for rapid, non-destruction, non-contact, at-wavelength qualification of large mask areas, and can be self-calibrating or be calibrated to well-characterized reference samples. It can further check for spatial variation of mask reflectivity or for global differences among masks. The apparatus and method is particularly suited for inspection of coating uniformity and quality and can detect defects in the order of 50 $\mu$m and above.

23 Claims, 5 Drawing Sheets

METHOD AND APPARATUS FOR INSPECTING AN EUV MASK BLANK

STATEMENT REGARDING FEDERALLY SPONSORED RESEARCH OR DEVELOPMENT

This invention was made with Government support under contract No. DE-AC03-76SF00098, awarded by the Department of Energy. The Government has certain rights in this invention.

CROSS-REFERENCE TO RELATED APPLICATIONS

Not Applicable

REFERENCE TO A MICROFICHE APPENDIX

Not Applicable

BACKGROUND OF THE INVENTION

1. Field of the Invention

The present invention pertains generally to extreme ultraviolet lithography (EUVL), and more particularly to at-wavelength inspection of reflective multilayer-coated mask blanks.

2. Description of the Background Art

Reflective extreme ultraviolet light (EUV) mask blanks, which are fabricated and subsequently patterned, are becoming critical elements in a relatively new photolithographic technology that incorporates EUV light. Mask blanks are formed from large (e.g., typically greater than four-inch square or diameter) substrates coated with a spatially uniform, reflective multilayer structure. The fabrication tolerances for lithographic quality mask blanks require reflectivity uniformity in the range of ±0.1%, and centroid wavelength variation of a few tenths of an angstrom. The success of this technology therefore relies on the development of metrology tools capable of accurately and efficiently measuring large numbers of mask blanks, both for the qualification of the mask blanks and the tools that produce them.

The characterization of a large number of EUV mask blanks has been an essential aspect of the calibration of various multilayer deposition tools, and in the cross-correlation of different multilayer characterization systems. In the current state of the art, when the coating uniformity is to be assessed, a narrowed EUV beam is focused to a relatively small spot on the mask. A suitable detector or detectors measures the power of the reflected beam, from which the reflectivity is calculated. During the measurement, a number of parameters may be varied, including the position of the measurement, the angle of incidence and the wavelength of the illumination. From these measurements, the multilayer d-spacing, $\Gamma$ parameter, and centroid- or peak-of-reflectivity wavelength may be determined.

The spatial dependence of the multilayer parameters is measured one spot at a time, in series. The size of the radiation spot on the mask blank controls, to some extent, the spatial resolution of the measurement. Where the spot is small, concern may arise that a sparse sampling of measurement positions on the mask may miss significant features. On the other hand, where the spot is relatively large, it may average together high- and low-quality regions producing results that may not characterize the sample well.

Therefore, there is a need for a method and apparatus for characterizing a large number of EUV blanks that is well suited for inspection of moderate and low spatial frequency coating uniformity. The present invention satisfies those needs, as well as others, and overcomes deficiencies in conventional approaches.

BRIEF SUMMARY OF THE INVENTION

The present invention pertains to a fast, large area, course preliminary inspection system for mask blank used in EUV lithography. By way of example, and not of limitation, the system comprises an EUV light source such as a synchrotron that directs a beam of light to a reflective mask blank, and an EUV detector such as a mega-pixel CCD camera array or micro-channel plate positioned to record the reflection from a relatively large area (i.e., multiple spots) of the mask blank in a single exposure. The system provides a 1:1 mapping of a large area of the mask blank, where each pixel in the array corresponds to a small area on the mask blank. This ability of the system to simultaneously record multiple spots of the mask blank provides for a faster inspection than conventional point by point inspection of small areas on the mask blank.

By adjusting the distance between the CCD camera array and the mask blank, an EUV light source that directs a beam of light to a mask blank, and an EUV detector such as a CCD camera array or micro-channel plate positioned to record the reflection from a relatively large area of mask blank in a single exposure. The size and position of EUV light source, as well as the size and position of the CCD camera array, determine the illumination area on mask blank and the area that can be inspected.

An object of the invention is to inspect EUV mask blanks for lithographic quality tolerances.

Another object of the invention is to detect any kind non-uniformity that may arise in the reflectivity of multilayer mirrors.

Another object of the invention is to determine if an EUV mask blank has a reflectivity uniformity in the range of ±1%.

Another object of the invention is to determine if an EUV mask blank has a centroid wavelength variation of a few tenths of an angstrom.

Another object of the invention is to accurately and efficiently inspect large numbers of EUV mask blanks.

Another object of the invention is to inspect a large area on an EUV mask blank in a single exposure to an EUV light source.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DETAILED DESCRIPTION OF THE INVENTION

The invention will now be described with reference to FIG. 1 through FIG. 6, where like reference numbers denote like parts. It will be appreciated that the apparatus may vary as to configuration and as to details of the parts, and that the method may vary as to the specific steps and sequence, without departing from the basic concepts as disclosed herein.

Figure 1:
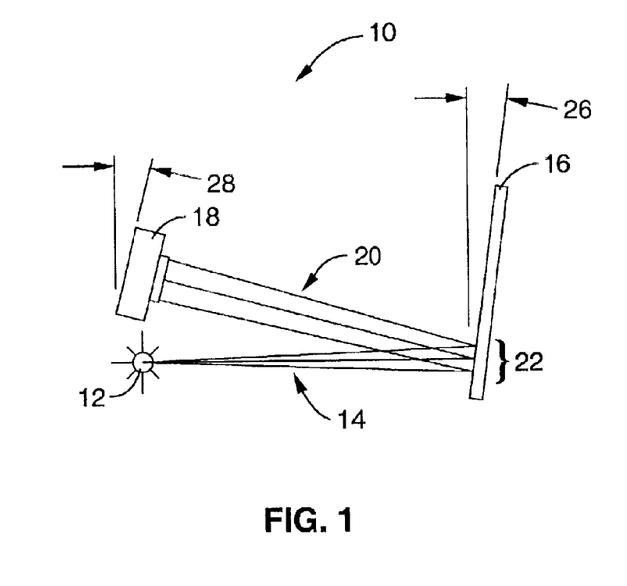
FIG. 1 is a schematic diagram of a mask blank inspection apparatus according to the present invention.
Figure 2:
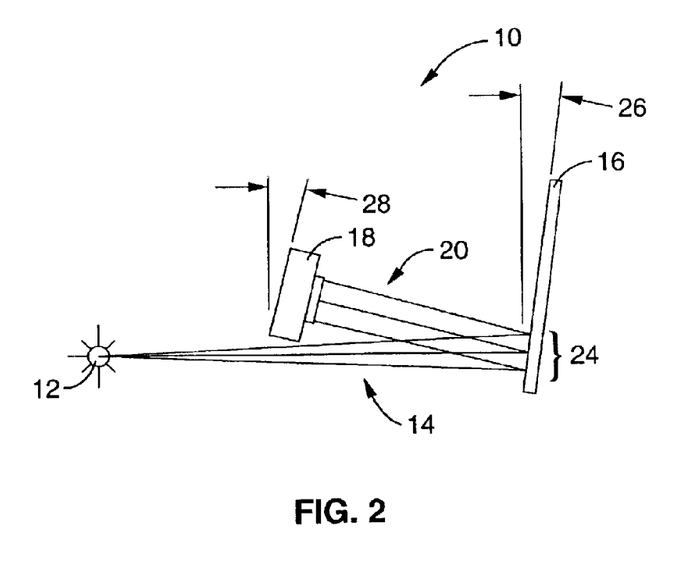
FIG. 2 is a schematic diagram of the mask blank inspection apparatus shown in FIG. 1 with the EUV detector reposition for inspecting a larger area of a mask blank.

Referring first to FIG. 1 and FIG. 2, an apparatus 10 for inspecting mask blanks for defects according to the present invention is shown. As used herein, the term "defect" is intended to encompass any kind of non-uniformity that may arise in the reflectivity of multi-layer mirrors. As can be seen, the apparatus comprises an EUV light source 12, such as a synchrotron or the like, that directs a beam of light 14 to a mask blank 16, and an EUV detector 18 such as a CCD camera array or micro-channel plate positioned to record the reflection 20 from a relatively large area of mask blank 16 in a single exposure. Mask blank 16 is typically a large (e.g., four-inch or greater square or diameter) polished substrate coated with a spatially uniform, reflective multilayer structure as commonly used in EUV lithography.

FIG. 1 and FIG. 2 show two configurations of the apparatus for inspecting small 22 and large 24 areas, respectively, where the angles and sizes shown are greatly exaggerated for heuristic reasons. Note that the size and position of EUV light source 12, as well as the size and position of EUV detector 18, determine the illumination area on mask blank 16 and the area that can be inspected. Additionally, EUV light source 12 should preferably have uniform, or well characterized illumination across the measurement area of mask blank 16.

Note the simplicity of the configurations shown in FIG. 1 and FIG. 2. The apparatus requires only two elements; namely, EUV light source 12 and the EUV detector 18, that are positioned in relation to mask blank 16. Furthermore, translation of mask blank 16 in a fixed measurement plane will enable the apparatus to probe and measure an arbitrarily large area of mask blank 16 in a single exposure. The angle of incidence 26 of mask blank 16 may also be adjusted to probe the angular dependence of the reflectivity. It will be appreciated, therefore, that rotation of the angle of mask blank 16 accompanied by appropriate re-positioning of the source or detector, or variation of the wavelength of EUV light source 12, enables the study of the multilayer parameters. In its default position, EUV detector 18 can remain fixed at an angle 28 normal to the central ray, which angle is preferably twice the inclination angle 26 of mask blank 16.

Figure 3:
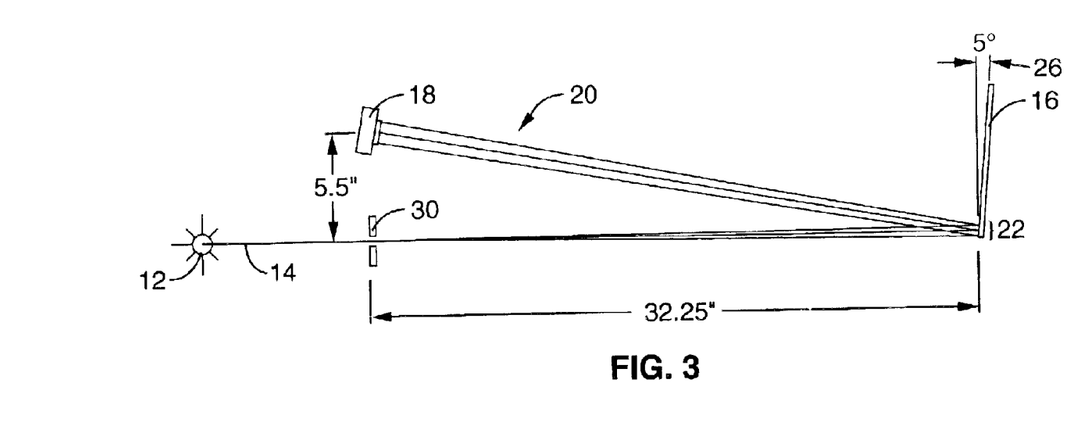
FIG. 3 is a detailed schematic diagram of the apparatus shown in FIG. 1.
Figure 4:
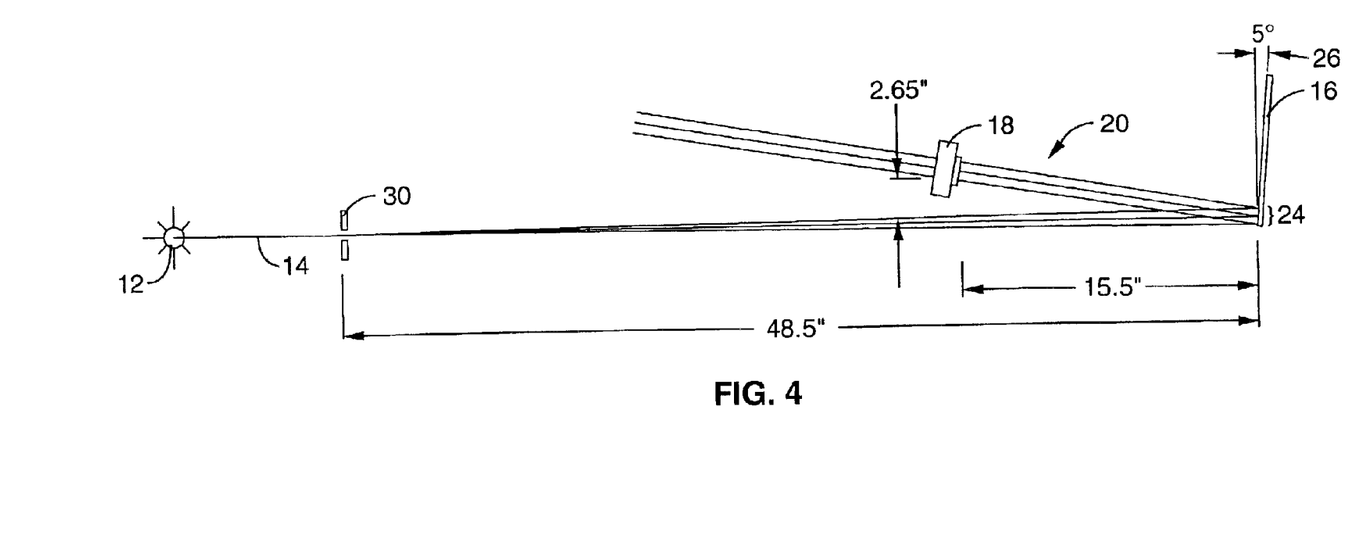
FIG. 4 is a detailed schematic diagram of the apparatus shown in FIG. 2.
Figure 5A:
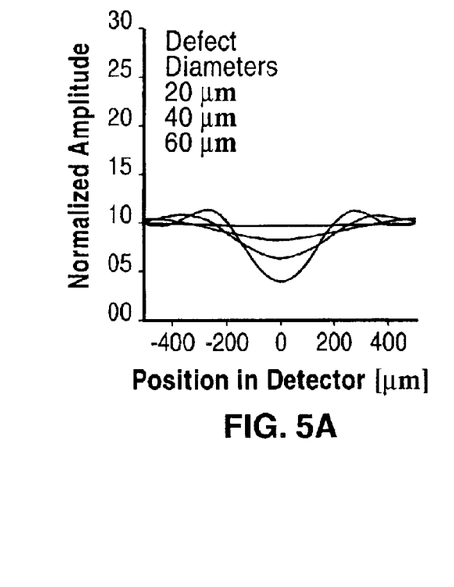
FIG. 5A through FIG. 5F are graphs showing the results of defect visibility simulation for various defect sizes based on the configuration shown in FIG. 3.
Figure 5B:
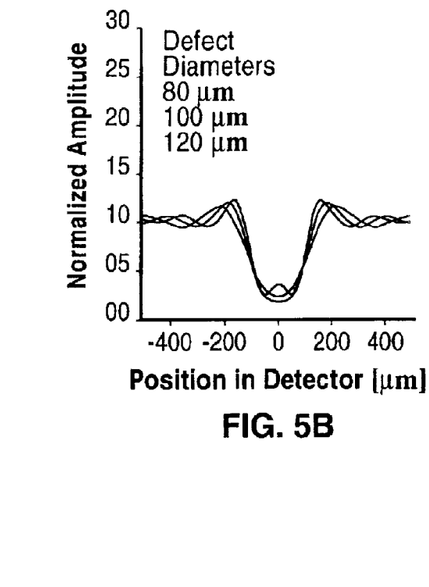
Figure 5C:
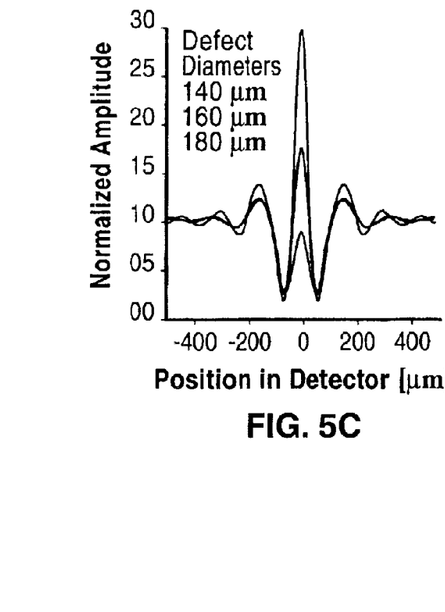
Figure 5D:
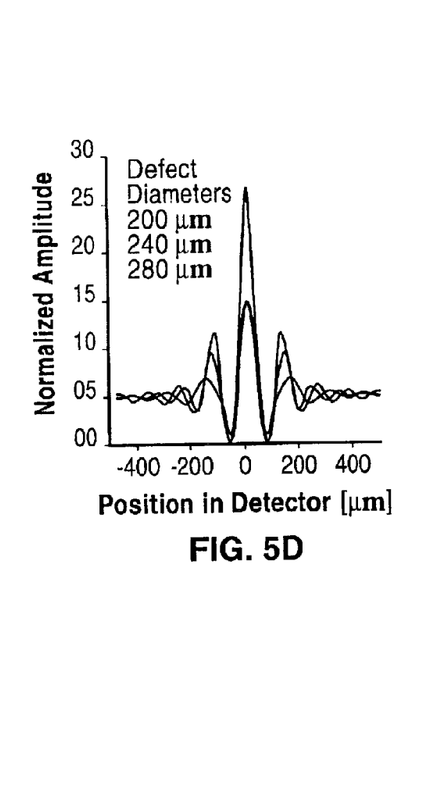
Figure 5E:
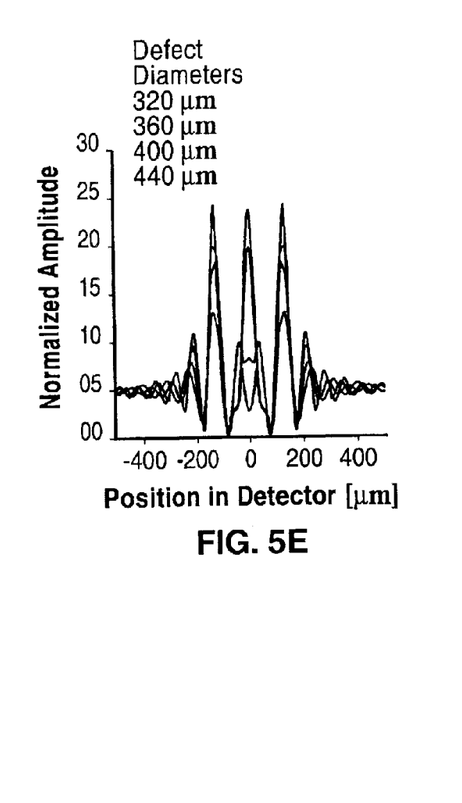
Figure 5F:
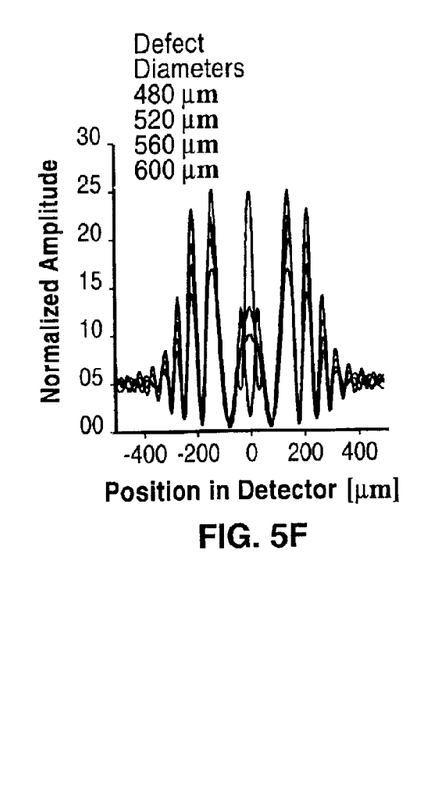

Referring now to FIG. 3 and FIG. 4, schematic scale drawings of the exemplary embodiments of the configurations shown in FIG. 1 and FIG. 2, respectively, can be seen. In FIG. 3 and FIG. 4, the EUV source beam 14 is directed through a pinhole filter 30 to provide a beam with an illumination angle corresponding to a numerical aperture (NA) of approximately 0.008, which is an appropriate value for spatially filtered light from an ALS undulator beamline 12.0.1.2. In FIG. 3, pinhole filter 30 and EUV detector 18 are positioned axially from mask blank 16 by 32.25 inches, the beam center of EUV detector 18 is 5.5 inches above the beam center of EUV beam 14, and angle of incidence 26 is five degrees. In FIG. 4, pinhole filter 30 is positioned 47.5 inches from mask blank 16, EUV detector 18 is positioned 15.5 inches from mask blank 16, EUV detector 18 is 2.65 inches above EUV beam 14, and angle of incidence 26 is five degrees.

As can be seen by comparing FIG. 4 with FIG. 3, moving mask blank 16 farther from EUV source 12 and bringing EUV detector 18 closer creates a larger single-exposure measurement area. In the example shown in FIG. 3, EUV detector 18 is one-inch square, the single-exposure measurement area 22 is 0.5 inches and a δ-fn defect appears 300 μm wide (12 pixels where pixel size is 25 μm). In contrast, in the example shown in FIG. 4, EUV detector 18 is one-inch square, the single-exposure measurement area 24 is 0.75 inches and a δ-fn defect appears 180 μm wide (7 pixels).

While FIG. 1 through FIG. 4 show preferred geometries of the apparatus, it will be appreciated that a wide range of geometries can be employed. This requires consideration of the following factors:

1. Measurement Area

It will be appreciated that the path of rays from EUV light source 12 to EUV detector 18 determines the measurement area on the mask, independent of the source divergence. In general, the closer the detector is placed to the mask, the closer the measurement area becomes to the size of the detector. Moving the detector farther away from the mask produces a greater geometric magnification, and reduces the size of the measurement area. For example, in the configuration of FIG. 3, with a one-inch-square detector array, the measurement area will be in the range of 0.5 inches square as described above, while in the configuration of FIG. 3, the measurement area will be in the range of 0.75 inches square.

2. Angular Range

Because multilayer reflectivity is sensitive to the angle of incidence, it is often desirable to illuminate the sample with a collimated beam, or a beam of limited solid angle. In the configurations shown in FIG. 1 through FIG. 4, it will be appreciated that a range of incident angles is unavoidable. However, with a diverging source, the sample may be moved an arbitrary distance away from the source, and EUV detector 18 repositioned to reduce the solid angle of the measurement area to any value.

Dependent strongly on the properties of EUV light source 12, this extra distance may reduce the illumination intensity and increase the exposure time. For example, assuming a one-half inch square measurement area, and using the edges of the square domain, the range of incident angles seen on the mask varies as a function of distance, D, as follows:

$$\theta = \pm \frac{1/2''}{D} = \pm \frac{1}{2D} \quad (1)$$

Table 1 shows various values of θ as a function of distance:

3. EUV Source

EUV light source 12 should preferably be able to uniformly illuminate the measurement area, or have an illumination pattern that can be measured and calibrated. For example, for a synchrotron beamline light source, this generally means that the illumination must be spatially filtered to produce a relatively uniform beam profile. The use of a laser-produced plasma source, a discharge lamp, or another non-synchrotron source must be evaluated on a case-by-case basis. Considering the angular range described above, it may be advantageous to use an EUV light source with a small divergence angle to achieve reasonable efficiency and utilize as much of the available light as possible.

4. Spatial Resolution

It will be further appreciated that the resolution of the invention is limited by diffraction, which depends on the wavelength, and a combination of the distance from EUV light source 12 to mask blank 16 and the distance from EUV detector 18 to mask blank 16. Because a large area of the mask sample is illuminated, localized, very small defects may fall below the sensitivity of the apparatus, except possibly in extreme cases. On the other hand, localized defects of slightly larger size will be visible by their shadow in the recorded image, and/or by interference fringes which they produce. The ability of the apparatus to produce fringes, in a way equivalent to an in-line hologram, depends largely on the spatial coherence of the illumination at the sample, which in turn depends on the size, position, and coherence of the source.

Simple calculations shown that the minimum resolvable feature sizes will be on the order of 100 $\mu$m to 200 $\mu$m for high-contrast amplitude or phase objects. FIG. 5A through FIG. 5F show the results of simple defect visibility simulations based on the geometry of FIG. 3 with equal source-to-mask and mask-to-CCD distances. A range of defect sizes from 20 $\mu$m to 600 $\mu$m was investigated. Below 100 $\mu$m it was found that the defects appear to have nearly the same lateral size, but the amplitude of the observed intensity variation depends on the size of the defect; that is, its diffracting strength. Because we are considering a defect illuminated by a spherical wavefront, the phase variation of the light hitting the defect plays a role. As can be expected, above 300 $\mu$m diameter, the observed size of the diffraction pattern begins to follow the increasing size of the defect.

5. Exposure Time

The exposure time depends on several critical parameters; namely, photon flux from EUV light source 12 into the solid angle of measurement F (ph/s), sensitivity c (counts per incident photon) of EUV detector 18, the array width W (pixels) of EUV detector 18, the reflectivity R of mask blank 16, and the required signal-to-noise ratio s.

For example, assume a desired sensitivity s of 0.1% at each measurement point in the area of measurement. Based on Poisson statistics, measurement with this signal-to-noise ratio requires $$\frac{1}{s^2} = \frac{1}{(10^{-3})^2} = 10^6 \text{ photons}$$

at each point. With a detector sensitivity c of five counts per incident photon, this indicates that $5 \times 10^6$ counts per measurement point are needed. Using a 16-bit CCD camera array (up to $2^{16} = 65536$ counts per pixel) for EUV detector 18, we would need to gather the signal from $$\frac{c}{s^2 2^{16}} = \frac{5 \times 10^6}{65536} = 76 \text{ pixels.}$$

To achieve this, assume that we collect the signal from the CCD array and bin or group the data into squares of width greater than $$\sqrt{\frac{c}{s^2 8}} = \sqrt{76} \approx 9.$$

For this calculation, 10 pixel×10 pixel squares should suffice. In a W×W=1024 pixel×1024 pixel array, there are $$\frac{W^2 s^2 2^{16}}{c} \approx \left(\frac{W}{10}\right)^2 = 10,400$$

such 10×10 squares, each receiving $10^6$ incident photons, for a granted total of $$\frac{W^2 2^{16}}{c} \approx 1 \times 10^{10} \text{ photons}$$

per exposure. The exposure time is therefore given by the number of photons per exposure divided by the source's photon flux into the solid angle of measurement, divided by the reflectivity, as follows:

$$\frac{W^2 2^{16}}{FRc}.$$

For ALS beamline 12.0.1.2, using a 0.75 $\mu$m spatial filter pinhole 30, the predicted exposure time per measurement is approximately $\frac{1}{40}^{th}$ second (F≈$8 \times 10^{11}$ photons/second). For ALS beamline 11, a bending magnet source, and F≈$8 \times 10^9$ photons/second, the predicted exposure time per measurement is 2.5 seconds. For the proposed next generation of EUV lithography sources, with collectable power output in the range of 10 Watts, F≈$10^{18}$ photons/second and the predicted exposure time per measurement is $2 \times 10^{-8}$ seconds to achieve a 0.1% signal-to-noise ratio (SNR). In that case, the measurement time limitation becomes the camera readout and data processing, and the overhead related to the stage motion. The time required to cover an 8-inch mask blank may be computed by the given times scaled upward by the ratio of the total area to the measurement area.

With 25 $\mu$m square pixels, the effective resolution of the detector becomes 250 $\mu$m after 10×10 binning. This corresponds to an area of approximately 125 $\mu$m on the mask, a size scale consistent with the stated resolution of the apparatus determined by diffraction.

With foregoing in mind, we now address a number of considerations for making measurements with this apparatus.

1. Redundant Measurement

To inspect large mask areas, the mask position preferably must be scanned, or advanced in discreet steps. To improve the signal-to-noise ratio and reduce measurement uncertainties from calibration, it may be useful to advance the mask position by a distance smaller than the single-step measurement area. At the expense of measurement time, this technique allows a given point on the mask to be illuminated from different positions and with different angles in the measurement area. By keeping track of positions on the mask and observing the reflected intensity multiple times at each mask point, the effects of illumination non-uniformities can be reduced or even studied. Furthermore, if the angular variation across the measurement area is large enough, moving the sample effectively scans the illumination angle seen by each point. To enhance this effect, the sample could be inclined so that the ideal illumination angle occurs not at the center of the field but rather at the edge. In this configuration, each snapshot of the reflected intensity shows a range of incidence angles.

2. Geometric Calibration

In order to calibrate the motion of the wafer-translation stage, preferably we set the position and angle of EUV detector 18, and adjust the alignment of the illuminating beam. One approach is to inspect a patterned mask blank. A non-reflecting pattern on the reflective surface may be a course grid of lines or dots that are visible (spatially resolvable) by EUV detector 18. The use of recognizable alignment marks could help in identifying specific patterns or locations on the mask. Misalignment of EUV detector 18 (including angular tilts) may be judged by measuring inhomogenaities in the observed pattern. To make these adjustments possible, it may be necessary to mount EUV detector 18 on a bellows or other flexible section of a vacuum chamber.

Figure 6:
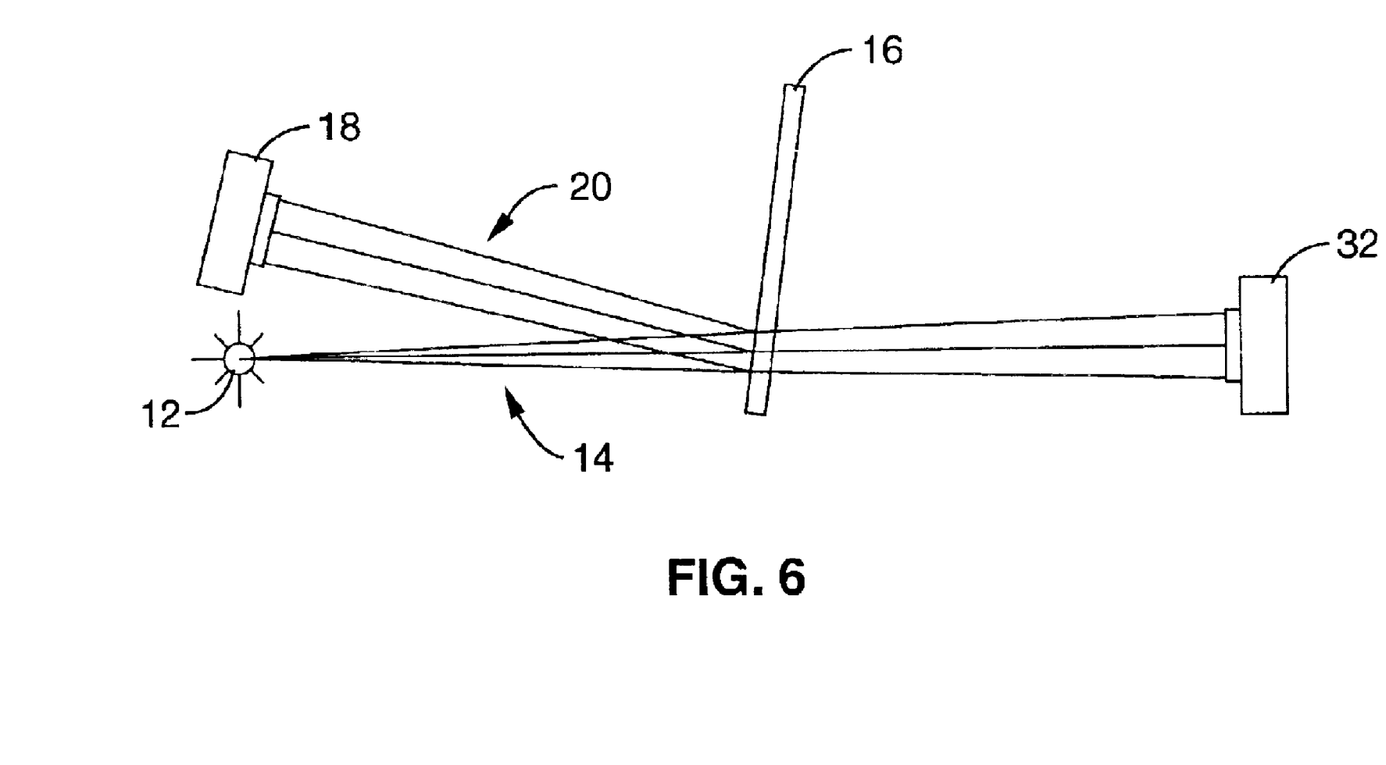
FIG. 6 is a schematic diagram of an embodiment of a mask blank inspection apparatus according to the invention that employs a detector for measuring the illumination pattern of the EUV light source.

3. Source Non-Uniformity

Where the uniformity of EUV light source 12 is a concern, the illumination pattern can be measured directly an EUV detector in a different position, an example of which is shown in FIG. 6. With mask blank 16 removed, light will fall directly onto a second EUV detector 32, which again is a CCD camera array or the like, which records the angular distribution of EUV light source 12. If necessary, this information can be used to calibrate the recorded intensity pattern of the light reflected from the masks. If long-term source stability is a concern (as it may be with a spatially filtered beam) the two EUV detectors 18, 32 can be used at all times. EUV detector 18 would be used for the reflection measurement, and EUV detector 32 would be used for illumination measurement. Mask blank 16 may simply be removed from the beam path to allow the straight-through light to reach EUV detector 32 at any time. EUV detector 32 may also be moved closer to the mask position if space is limited.

4. Non-Tunable Source

If EUV light source 12 is not tunable, the multilayer parameters may be calculated from the measurement of the angular dependence of the reflectivity. In this situation the angle of the mask blank 16 should be adjustable. It may be preferable to rotate the mask about an axis perpendicular to the plane containing the illumination's central ray and its reflection. Due to the change in geometry as the top and bottom portions of the illuminated mask area move closer or farther from EUV detector 18, additional geometric calibration may be required for proper analysis.

5. Extreme Simple Implementation

One essential characteristic of a uniform mask blank is that the reflectivity has no spatial variation. Without calibrating the illumination angles, the EUV light source intensity distribution, the EUV detector geometry or even the illumination wavelength, one could translate a sample in-plane during measurement and simply look either for spatial non-uniformities, or a measurable difference from a well-calibrated mask blank used as a reference. Because the multilayer reflectivity varies slowly near the peak (as a function of angle, or wavelength) to increase the sensitivity of the measurement, the apparatus could be operated intentionally off-peak. Here again, spatial variations in the reflected intensity could be observed.

Although the description above contains many specific implementations, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

TABLE 1

| D (inches) | D (cm) | θ (mrad) | θ degrees |
|---|---|---|---|
| 10.000 | 25.400 | ± 50.000 | ± 2.865 |
| 20.000 | 50.800 | ± 25.000 | ± 1.432 |
| 50.000 | 127.000 | ± 10.000 | ± 0.573 |
| 100.000 | 254.000 | ± 5.000 | ± 0.286 |

What is claimed is:

1. An apparatus for inspecting a reflective EUV mask blank for defects, comprising:
    an EUV light source; and
    a CCD camera array configured for simultaneously imaging multiple points in an area of a mask blank in response to reflections of light from said EUV light source impinging on said mask blank.

2. An apparatus for inspecting a reflective EUV mask blank for defects, comprising:
    an EUV light source; and
    a micro-channel plate detector configured for simultaneously imaging multiple points in an area of a mask blank in response to reflections of light from said EUV light source impinging on said mask blank.

3. An apparatus as recited in claim 1 or 2, wherein said EUV light source comprises a synchrotron.

4. An apparatus as recited in claim 1 or 2, further comprising a pinhole filter positioned between said EUV light source and said mask blank.

5. An apparatus for inspecting a reflective EUV mask blank for defects, comprising:
    means for directing EUV light to a mask blank; and
    a CCD camera array configured for simultaneously imaging multiple points of an area of a mask blank in response to reflections of EUV light impinging on said mask blank.

6. An apparatus for inspecting a reflective EUV mask blank for defects, comprising:
    means for directing EUV light to a mask blank; and
    a micro-channel plate detector configured for simultaneously imaging multiple points of an area of a mask blank in response to reflections of EUV light impinging on said mask blank.

7. An apparatus as recited in claim 5 or 6, wherein said means for directing EUV light comprises a synchrotron.

8. An apparatus as recited in claim 5 or 6, further comprising a pinhole filter positioned between said means for directing EUV light and said mask blank.

9. An apparatus for inspecting a reflective EUV mask blank for defects, comprising:
    an EUV light source configured to direct a beam of light toward a mask blank; and
    an EUV detector configured to simultaneously image multiple points of an area of said mask blank in response to light from said EUV light source reflected from said area of said mask blank to be imaged;

wherein said EUV detector is selected from the group of detectors consisting of a CCD camera array and a micro-channel plate detector.

10. An apparatus as recited in claim 9, wherein said EUV light source comprises a synchrotron.

11. An apparatus as recited in claim 9, further comprising a pinhole filter positioned between said EUV light source and said mask blank.

12. An apparatus for inspecting a reflective EUV mask blank for defects, comprising an EUV light source positioned to direct a beam of light to a mask blank, and an EUV detector positioned to simultaneously record the reflection from a multiple points of an area of the mask blank in a single exposure to said EUV light source, wherein said EUV detector is selected from the group of detectors consisting of a CCD camera array and a micro-channel plate detector.

13. An apparatus as recited in claim 12, wherein said EUV light source comprises a synchrotron.

14. An apparatus as recited in claim 12, further comprising a pinhole filter positioned between said EUV light source and said mask blank.

15. A method for inspecting a reflective EUV mask blank for defects, comprising simultaneously imaging multiple points of an area of a mask blank with an EUV detector in response to reflections of light from an EUV light source impinging on said mask blank, wherein said EUV detector is selected from the group of detectors consisting of a CCD camera array and a micro-channel plate detector.

16. A method as recited in claim 15, wherein said EUV light source comprises a synchrotron.

17. A method as recited in claim 15, further comprising filtering said EUV light source with a pinhole filter.

18. A method for inspecting a reflective EUV mask blank for defects, comprising:
   directing a beam of light from an EUV light source toward a mask blank; and
   simultaneously imaging multiple points of an area of said mask blank with an EUV detector in response to light from said EUV light source reflected from said area of said mask blank to be imaged;
   wherein said EUV detector is selected from the group of detectors consisting of a CCD camera array and a micro-channel plate detector.

19. A method as recited in claim 17, wherein said EUV light source comprises a synchrotron.

20. A method as recited in claim 18, further comprising filtering said EUV light source with a pinhole filter.

21. A method for inspecting a reflective EUV mask blank for defects, comprising:
   positioning an EUV light source to direct a beam of light to a mask blank;
   positioning an EUV detector to simultaneously record the reflection from multiple points of an area of the mask blank in a single exposure to said EUV light source; and
   analyzing said recorded reflection to determine the presence of a defect in said mask blank;
   wherein said EUV detector is selected from the group of detectors consisting of a CCD camera array and a micro-channel plate detector.

22. A method as recited in claim 21, wherein said EUV light source comprises a synchrotron.

23. A method as recited in claim 21, further comprising filtering said EUV light source with a pinhole filter.

* * * * *